(12) United States Patent
Ma et al.

(10) Patent No.: US 6,800,218 B2
(45) Date of Patent: Oct. 5, 2004

(54) ABRASIVE FREE FORMULATIONS FOR CHEMICAL MECHANICAL POLISHING OF COPPER AND ASSOCIATED MATERIALS AND METHOD OF USING SAME

(75) Inventors: Ying Ma, Weatherford, TX (US); Michael Jones, Phoenix, AZ (US); Thomas H. Baum, New Fairfield, CT (US); Deepak Verma, Scottsdale, AZ (US); David Bernhard, Newtown, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/935,805

(22) Filed: Aug. 23, 2001

(65) Prior Publication Data

US 2003/0047539 A1 Mar. 13, 2003

(51) Int. Cl.$^7$ .............................................. C09K 13/00
(52) U.S. Cl. .................... 252/79.1; 252/79.2; 252/79.3; 252/79.4
(58) Field of Search ............................. 252/79.1, 79.2, 252/79.3, 79.4

(56) References Cited

U.S. PATENT DOCUMENTS

| 5,770,095 | A | | 6/1998 | Sasaki et al. |
| 5,800,577 | A | | 9/1998 | Kido |
| 5,858,813 | A | | 1/1999 | Scherber et al. |
| 5,866,031 | A | * | 2/1999 | Carpio et al. ............... 252/79.1 |
| 5,922,091 | A | | 7/1999 | Tsai et al. |
| 5,972,792 | A | | 10/1999 | Hudson |
| 5,985,748 | A | | 11/1999 | Watts et al. |
| 6,117,775 | A | * | 9/2000 | Kondo et al. ................ 438/690 |
| 6,221,774 | B1 | | 4/2001 | Malik |
| 6,232,231 | B1 | | 5/2001 | Sethuraman et al. |
| 6,409,781 | B1 | * | 6/2002 | Wojtczak et al. ............. 51/308 |
| 6,451,697 | B1 | * | 9/2002 | Sun et al. .................... 438/691 |
| 2002/0016073 | A1 | * | 2/2002 | Kondo et al. ................ 438/691 |
| 2002/0148169 | A1 | * | 10/2002 | Sun et al. ...................... 51/309 |
| 2002/0173221 | A1 | * | 11/2002 | Li et al. ......................... 451/5 |

FOREIGN PATENT DOCUMENTS

WO    01/23486    4/2001

OTHER PUBLICATIONS

Yongsik Moon, et al., Finishing of Advanced Ceramics and Glasses Symposium at the 101$^{st}$ Annual Meeting of the American Ceramic Society, pp. 269–279, Identification of the Mechanical Aspects of Material Removal Mechanisms in Chemical Mechanical Polishing (CMP)., (Apr. 25–28, 1999).

Seiichi Kondo, et al., Journal of the Electrochemical Society, 147 (10) pp. 3907–3913, "Abrasive–Free Polishing for Copper Damascene Interconnection" (2000).

Hayashi, et al., A New Abrasive–Free, Chemical–Mechanical–Polishing Technique for Aluminum Metallization of ULSI Devices, IDEM, 1992, pp. 976–978.

* cited by examiner

*Primary Examiner*—George A. Goudreau
(74) *Attorney, Agent, or Firm*—Margaret Chappuis; Steven L. Hultquist

(57) ABSTRACT

An abrasive free formulation for chemical mechanical polishing and method for using the formulation for polishing copper and related materials. The abrasive free formulation has a high removal rate on copper and a low removal rate on barrier material. The abrasive free formulation comprises at least an oxidizing agent and an activating agent.

36 Claims, 9 Drawing Sheets

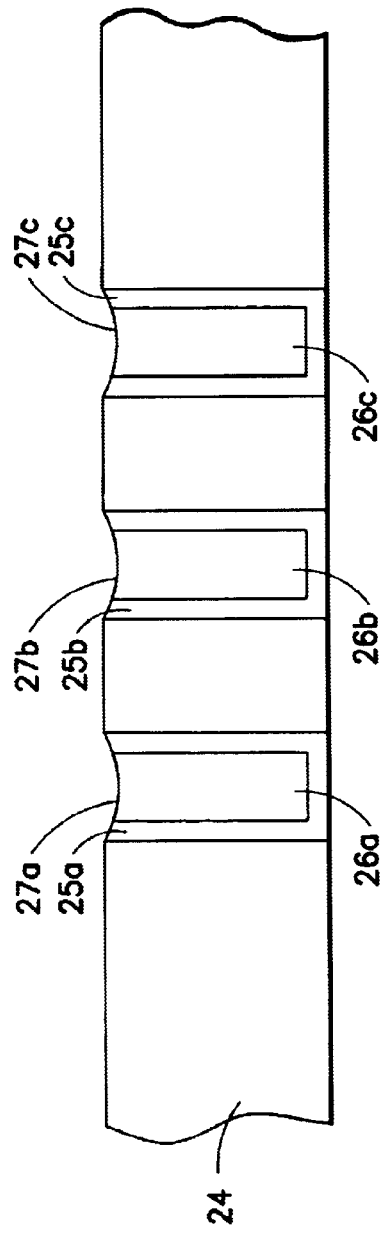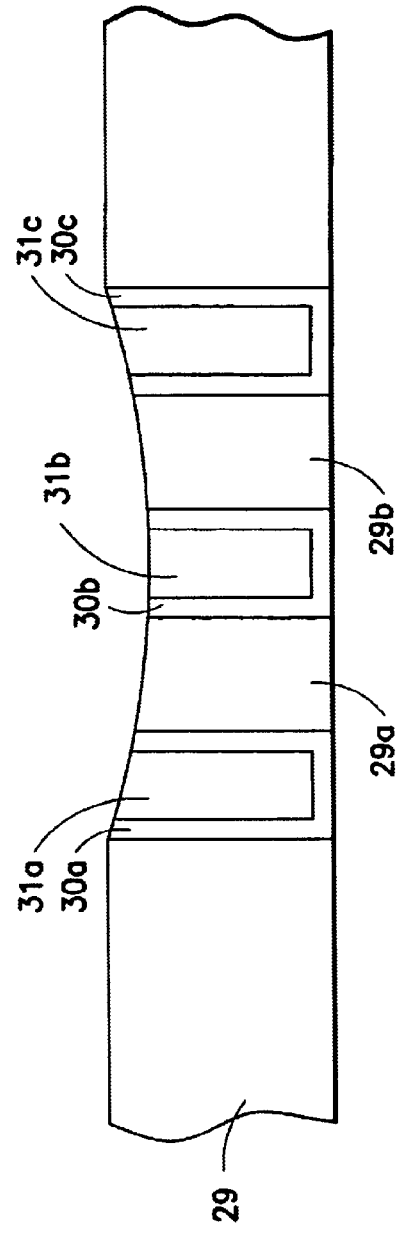

ABRASIVE FREE FORMULATIONS FOR CHEMICAL MECHANICAL POLISHING OF COPPER AND ASSOCIATED MATERIALS AND METHOD OF USING SAME

TECHNICAL FIELD OF THE INVENTION

The present invention relates generally to the chemical mechanical polishing of semiconductor devices systems and methods, and more particularly, to a formulation and method for use in polishing metal films in semiconductor interconnection processes.

BACKGROUND OF THE INVENTION

The present invention relates to a polishing formulation for surfaces of a semiconductor wafer, and more particularly, to a polishing formulation and a method for using the polishing formulation to remove and polish metal containing materials layered on semiconductor wafer surfaces.

Semiconductor wafers are used to form integrated circuits. The semiconductor wafer typically includes a substrate, such as silicon, upon which dielectric materials, barrier materials, and metal conductors and interconnects are layered. These different materials have insulating, conductive or semi-conductive properties. Integrated circuits are formed by patterning regions into the substrate and depositing thereon multiple layers of dielectric material, barrier material, and metals.

In order to meet the higher speeds required in large scale integration (LSI), semiconductor manufacturers are looking to copper and its alloys for interconnections due to its decreased resistivity. Copper is also less vulnerable to electromigration than aluminum and less likely to fracture under stress.

In conventional deposition, a layer of metal and a layer of a masking material called photoresist are deposited on a silicon wafer. Unwanted metal is then etched away with an appropriate chemical, leaving the desired pattern of wires or vias. Next, the spaces between the wires or vias are filled with silicon dioxide or other low k dielectric as insulator, and finally the entire wafer surface is polished to provide a planar surface and/or remove excess insulator. In copper deposition the damascene method is used wherein the pattern of wires or vias is first formed by etching the silicon dioxide or other suitable insulator such as fluorinated silica glass, Silk®, or methylsilsesquioxane etc. The metal is then deposited second.

Typically for copper technology, the layers that are removed and polished consist of a copper layer (about 1–1.5 $\mu$m thick) on top of a thin copper seed layer (about 0.05–0.15 $\mu$m thick). These copper layers are separated from the dielectric material surface by a layer of barrier material (about 50–300 Å thick).

In order to obtain the correct patterning, excess material used to form the layers on the substrate must be removed. Further, to obtain efficient circuits, it is important to have a flat or planar semiconductor wafer surface. Thus, it is necessary to polish certain surfaces of a semiconductor wafer.

Chemical Mechanical Polishing or Planarization ("CMP") is a process in which material is removed from a surface of a semiconductor wafer, and the surface is polished (planarized) by coupling a physical process such as abrasion with a chemical process such as oxidation or chelation. In its most rudimentary form, CMP involves applying slurry, a solution of an abrasive and an active chemistry, to a polishing pad that buffs the surface of a semiconductor wafer to achieve the removal, planarization, and polishing process.

Copper CMP often employs a two-step slurry approach. The slurry used in the first step has a high copper removal rate and a comparatively low barrier material removal rate. The slurry used in the second step has a relatively high barrier material removal rate, comparable removal rate for copper and low or comparable removal rate on the dielectric material.

As successive layers are deposited across previously patterned layers of an integrated circuit, elevational disparity develops across the surface of each layer. If left unattended, the elevational disparities in each level of an integrated circuit can lead to various problems. For example, when dielectric, conductive, or semiconductive material is deposited over a topological surface having elevationally raised and recessed regions, step coverage problems may arise. Step coverage is defined as a measure of how well a film conforms over an underlying step and is expressed by the ratio of the minimum thickness of a film as it crosses a step to the nominal thickness of the film over horizontal regions. Also, stringers or fences may arise from incomplete etching, polishing, or redeposition of metal.

One key to obtaining good uniformity across the wafer surface is by using a polishing formulation that has a higher removal selectivity for copper than the underlying barrier layer. If such selectivity is not maintained, unwanted dishing of copper and/or erosion of the dielectric material may occur.

Typical commercial CMP slurries used to remove overfill material and polish semiconductor wafer surfaces have a barrier material removal rate below 500 Å/min. Further, these slurries have a copper to barrier material removal rate selectivity of greater than 4:1. This disparity in removal rates during the removal and polishing of the barrier material results in significant dishing of copper on the surface of the semiconductor wafer and/or poor removal of the barrier material.

Another problem with conventional CMP slurries is that the removal chemistry of the slurry is compositionally unstable. CMP slurries using ceria, alumina, or fumed silica must be continuously agitated or the abrasive particles will rapidly settle out. Further, many of the colloidal and fumed abrasives agglomerate after relatively short time frames following addition to the supporting chemistry. Both of these problems lead to significant operational obstacles such as the need for an expensive continuously recirculating distribution system equipped with filtration, chemistry monitoring, chemical addition equipment, and on-line particle monitors.

A further problem in commercial CMP slurries is that the abrasive materials in the slurries produce defects in the form of micro scratches. The scratches and other defects occur due to the solid abrasive, in particular alumina, which is the main material used as a metal polishing abrasive. Slurry remains behind in the micro-scratches causing the semiconductor device to fail. Micro scratches and poor planarization efficiency result in integrated circuits with increased defects and a lower yield.

Further, abrasive particles remain behind on the substrate surface after CMP. Cleaning machines or scrubbers using mechanical cleaning must be employed to remove the excess material.

Still another problem of commercial CMP slurries is that the chemicals that make up the slurries produce a copper surface that has a high corrosion tendency post polish.

A further problem that occurs in commercial CMP relates to the peeling of the metal film surface from the substrate due to frictional force between the polishing abrasive and the metal film surface.

A still further problem that exists for semiconductor manufacturers in commercial CMP is the cost of abrasives, polishing pads, slurry feeders, processor for slurry containing waste and stirrers to prevent sedimentation of the abrasive in the slurry feeder.

Further, since CMP machines are set up in cleanroom environments, the dust generated by the solid abrasive material must be kept to a minimum This requires expensive systems to be installed to suppress dust in the exhaust duct of the CMP machine;

Therefore, it is an object of this invention, to provide an abrasive free polishing formulation for the removal of copper and other metal interconnects that overcomes the current problems in CMP processing.

An object of this invention, therefore, is to provide an abrasive free polishing formulation having a high copper removal rate; high uniformity of the planarized surface and a comparatively low barrier material removal rate with minimal dishing and/or erosion.

These and other objects and advantages of the invention will be apparent to those skilled in the art upon reading the following detailed description and upon reference to the drawings.

SUMMARY OF THE INVENTION

The present invention relates to an abrasive free polishing formulation for removing at least a portion of a metal film deposited during a semiconductor-processing step. The present invention eliminates or reduces disadvantages associated with chemical mechanical polishing processes comprising abrasive components and provides an important technical advantage by eliminating the abrasive component of the slurry thereby reducing the cost of ownership to semiconductor manufacturing facilities.

The present invention is directed to an abrasive-free polishing formulation, which has a high removal rate on copper and a low removal rate on barrier material and a method of polishing a metal containing material using the abrasive free polishing formulation.

The present invention is directed to a non-abrasive polishing formulation comprising a first slurry, which has a high removal rate on copper and a low removal rate on barrier material and a chemical mechanical polishing method of using the non-abrasive polishing formulation.

More specifically, in one aspect, the present invention relates to an abrasive free polishing formulation for removing at least a portion of a metal film, comprising an oxidizing agent and a corrosion inhibitor said formulation having a pH in the range of from about 0.1 to 6.9.

In a further aspect, the present invention relates to a polishing method for removing at least a portion of a metal film, comprising mechanically rubbing a metal film surface using a solution comprising an oxidizing agent and a corrosion inhibitor said formulation having a pH in the range of from about 0.1 to 6.9.

As will become apparent from the discussion that follows, the stable abrasive free formulation and method of using said formulation provide for removal of material and polishing of semiconductor wafer surfaces with significantly no dishing or oxide erosion, with significantly no surface defects and good planarization efficiency, and produce a copper surface with minimal corrosion tendency post-polish.

BRIEF DESCRIPTION OF THE DRAWINGS

FIG. 3 is a cross sectional view of a semiconductor wafer illustrating copper dishing.

FIG. 4 is a cross sectional view of a semiconductor wafer illustrating oxide or dielectric erosion.

DETAILED DESCRIPTION OF THE INVENTION AND PREFERRED EMBODIMENTS THEREOF

Figure 1:
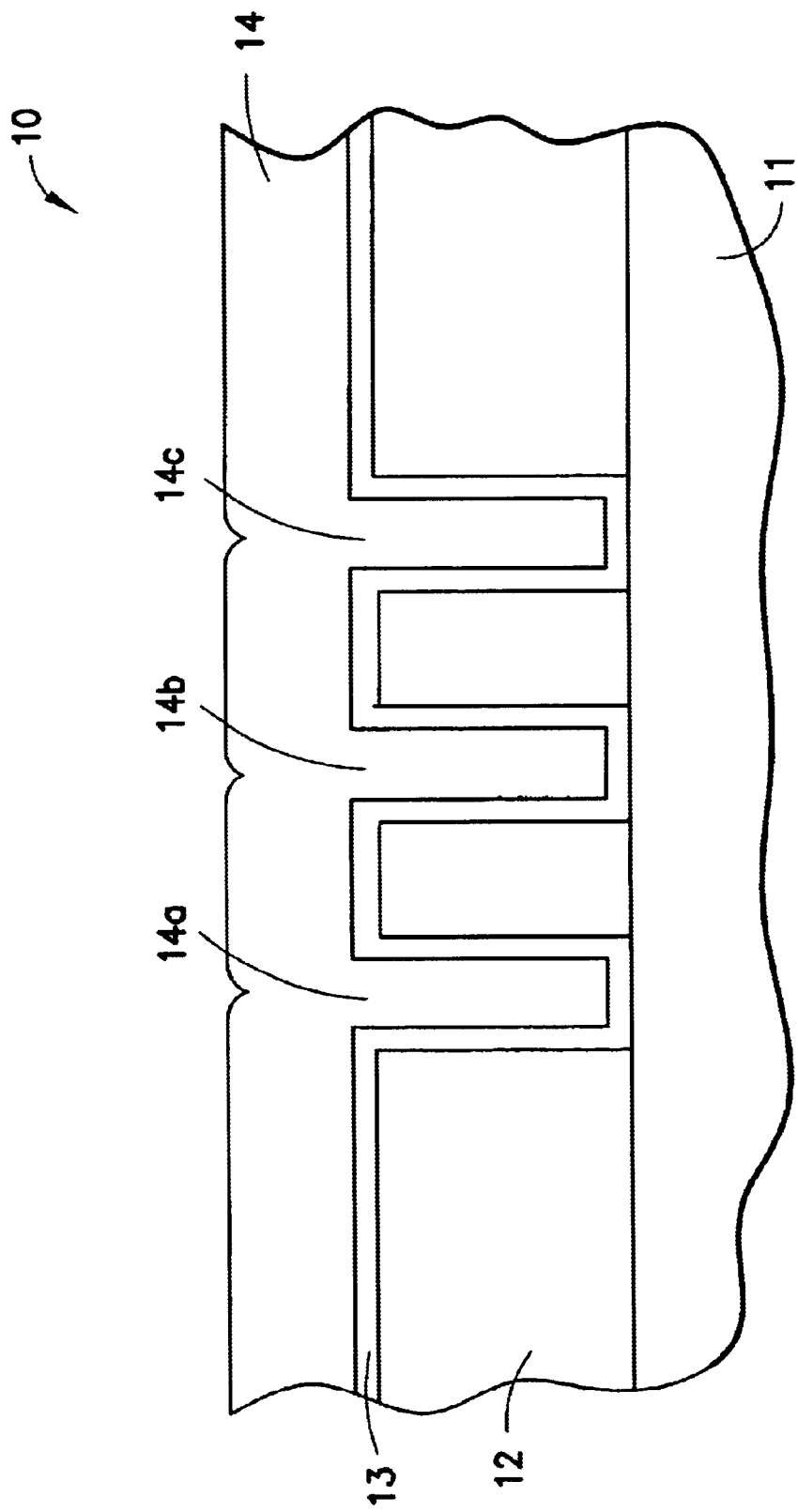
FIG. 1 is a cross sectional view of a semiconductor wafer prior to chemical mechanical polishing with the abrasive free formulation of the present invention.

The disclosure of the following United States patent application, which is commonly owned by assignee of the present application is hereby incorporated herein by reference in its entirety:

U.S. patent application Ser. No. 09/562,298 filed on May 1, 2000 in the names of Thomas H. Baum, et al.

The present invention provides an abrasive free chemical mechanical polishing formulation and method of using such formulation for removing and polishing the bulk copper layer of a damascene processing step in the manufacturing of an integrated circuit.

Applicants' co pending U.S. patent application Ser. No. 09/562,298 discloses a first and second slurry wherein the first slurry is used to remove bulk copper down to a barrier layer. The first slurry has a high removal rate on copper and a low removal rate on barrier material and comprises silica particles, an oxidizing agent, a corrosion inhibitor, and a cleaning agent. More particularly the first slurry is preferentially comprised of 1–10% colloidal silica with particle size range of from 3 to 100 nm, or 1–5% fumed silica with mean particle size of less than about 700 nm, about 1–12% potassium iodate ($KIO_3$, formed by reaction of $HIO_3$ with KOH), which is used as the oxidizing agent for the copper, about 0–5% concentrated inorganic acid as a copper activating agent, and 0–2% iminodiacetic acid (IDA) as the copper corrosion inhibitor and cleaning agent.

In an effort to solve the aforementioned problems relating to the abrasive portion of the CMP slurry, which are summarized below:

reduction of scratches caused by the solid abrasive;
peeling due to frictional force between the polishing abrasive and the metal film surface during CMP;

mechanical cleaning step to remove polishing abrasive left behind after the polishing step;

cost of abrasives, polishing pads, slurry feeders, processor for slurry containing waste and pumps, filters, monitoring equipment, and stirrers to prevent sedimentation of the abrasive in the slurry distribution system; and a system to suppress dust in the exhaust duct of the CMP machine, the inventors of the present invention experimentally removed the abrasive component of the CMP slurry, and used the abrasive free formulation to chemical mechanically polish a wafer having deposited thereon a bulk copper layer from a damascene processing step. The inventors unexpectedly discovered that the particular combination of potassium iodate, inorganic acid, and iminodiacetic acid removed the bulk copper layer at a rate >3100 Å/min and as high as 4000 Å/min in preliminary testing. Such removal rates are not significantly different from the same formulation comprising abrasive.

The present invention presents a novel abrasive free chemical mechanical polishing formulation that overcomes the deficiencies in the prior art while providing a manufacturable process that may be implemented in the semiconductor-manufacturing arena with little or no alterations to the current CMP systems and footprints. As will become apparent from the examples that follow, the stable abrasive free CMP formulation and method of using such formulation of the present invention provide for removal of material and polishing of semiconductor wafer surfaces with significantly no dishing or oxide erosion, with significantly no surface defects and good planarization efficiency.

Table 1, below outlines a comparison between the first slurry formulation of U.S. patent application Ser. No. 09/562,298 and one formulation of the abrasive free first slurry of the present invention. Both formulations comprise about 1–12% potassium iodate ($KIO_3$, formed by reaction of $HIO_3$ with KOH), which is used as the oxidizing agent for the copper, about 0–5% concentrated inorganic acid as a copper activating agent, and 0–2% iminodiacetic acid (IDA) as a copper corrosion inhibitor and cleaning agent. Additionally, the First Slurry of U.S. patent application Ser. No. 09/562,298 further comprises either precipitated spherical silica particles in the size range of 3 to 100 nm, or fumed silica with mean particle size less than about 700 nm.

TABLE 1

Comparison of Removal Rates of First Slurries on Different Materials based on the preferred embodiment of U.S. Patent Application No. 09/562,298 as compared to the abrasive free polishing formulation (AFS) of the present invention.

| LAYER | First Slurry Removal Rates* (Å/min) (U.S. 09/562,298) | Selectivity Material:Cu First Slurry (U.S. 09/562,298) | First Slurry Removal Rates** (Å/min) (AFS) | Selectivity Material:Cu First Slurry (AFS) |
|---|---|---|---|---|
| Copper | >5000 | | >3500 | |
| Tantalum | <500 | 1:10 | <8 | 1:500 |
| Tantalum Nitride | <500 | 1:10 | <60 | 1:61 |
| Thermal Oxide | <150 | 1:50 | <5 | 1:730 |

*(Down Force = 5 psi, Flow Rate = 200 mL/min, Table Speed = 90 rpm, Quill Speed = 50 rpm, Pad Type = IC 1000)
**(Down Force = 4 psi, Flow Rate = 160 mL/min, Table Speed = 125 rpm, Quill Speed = 116 rpm, Pad Type = IC 1000)

In one embodiment, the present invention is directed to an aqueous abrasive free polishing formulation comprising an oxidizing agent and a copper corrosion inhibitor agent having a pH in a range of from about 0.1 to 6.9. More preferably the pH of the formulation is in the range from about 2 to 5 and most preferably, the pH of the polishing formulation is in the range of from about 3 to 4.

In a further embodiment, the present invention is directed to an aqueous abrasive free polishing formulation comprising 0.1 to 20 weight percent oxidizing agent and 0 to 5 weight percent copper corrosion inhibitor agent and 0–5 weight percent activating agent, said formulation having a pH in a range of from about 0.1 to 6.9. More preferably the pH of the formulation is in the range from about 2 to 5 and most preferably, the pH of the polishing formulation is in the range of from about 3 to 4.

As used herein, the term oxidizing agent is defined as any substance which removes metal electrons and raises the atomic valence and includes but is not limited to hydrogen peroxide ($H_2O_2$), ferric nitrate ($Fe(NO_3)_3$) and potassium iodate ($KIO_3$), nitric acid ($HNO_3$), ammonium chlorite ($NH_4ClO_2$), ammonium chlorate ($NH_4ClO_3$), ammonium iodate ($NH_4IO_3$), ammonium perborate ($NH_4BO_3$), ammonium perchlorate ($NH_4ClO_4$), ammonium periodate ($NH_4IO_3$), ammonium persulfate (($NH_4)_2S_2O_8$), tetramethylammonium chlorite (($N(CH_3)_4)ClO_2$), tetramethylammonium chlorate (($N(CH_3)_4)ClO_3$), tetramethylammonium iodate (($N(CH_3)_4)IO_3$), tetramethylammonium perborate (($N(CH_3)_4)BO_3$), tetramethylammonium perchlorate (($N(CH_3)_4)ClO_4$), tetramethylammonium periodate (($N(CH_3)_4)IO_4$), tetramethylammonium persulfate (($N(CH_3)_4)S_2O_8$), urea hydrogen peroxide (($CO(NH_2)_2)H_2O_2$). The preferred oxidizing agent for the abrasive free formulation of the instant invention is potassium iodate formed by reaction of $HIO_3$ with KOH. Preferably, the oxidizing agent of the present invention is potassium iodate.

Alternatively, the oxidizing agent may comprise an amine N-oxide having the formula ($R_1R_2R_3N \rightarrow O$), wherein $R_1R_2R_3$ are independently selected from the group consisting of: H and $C_1$–$C_8$ alkyl. Specific examples of amine N-oxides include but are not limited to 4-methylmorpholine N-oxide ($C_5H_{11}NO_2$) and pyridine N-oxide ($C_5H_5NO$).

Further, as used herein, the term copper-activating agent is defined as any substance that in the presence of a water containing solution solubilizes or etches the oxidized copper material. Copper activating agents useful in the present invention include but are not limited to mineral acids (i.e. hydrochloric acid, nitric acid), inorganic acids (i.e. phosphoric acid, fluoroboric acid) and organic acids (i.e. oxalic acid, malonic acid, malic acid, citric acid, acetic acid and pivalic acid).

In a further embodiment, the abrasive free CMP formulation of the present invention, may comprise, an oxidizing agent, an activating agent, a corrosion inhibitor and optionally a cleaning agent. The chemistry of the formulation should be stable and have a pH in the range of about 0.1 to 6.9 and more preferably between about 2 to 5. More preferably, the abrasive free polishing formulation comprises from about 1–13% potassium iodate ($KIO_3$, formed by reaction of $HIO_3$ with KOH), which is used as the oxidizing agent for the copper, about 0–5% concentrated inorganic acid as the copper activating agent, and 0–2% iminodiacetic acid (IDA) as the copper corrosion inhibitor agent.

The formulation may further comprise potassium hydroxide, tetramethylammonium hydroxide (or related quaternary ammonium hydroxide) or ammonium hydroxide in such amounts as to adjust the pH to the desired level. A buffering solution of suitable identity could also be used to adjust the pH value.

As used herein the copper corrosion inhibitor is defined as a substance that reacts with the oxidized copper thin film to passivate the copper layer and prevent excessive etching of the copper surface during CMP and the cleaning agent is defined as a substance that chelates to the copper, leading to soluble copper complexes that can be readily removed during polishing. The corrosion inhibitor and cleaning agent for the abrasive free formulation are preferably a carboxylic acid. More specifically, the carboxylic acid may be chosen from, but not limited to glycine, oxalic acid, malonic acid, succinic acid, citric acid, and nitrilotriacetic acid. Alternatively, the carboxylic acid may be a dicarboxylic acid that preferentially has a nitrogen containing functional group. In the most preferred form, the corrosion inhibitor and the cleaning agent are iminodiacetic acid.

Referring to FIG. 1, the present invention includes a method for chemical mechanical polishing of a copper containing material 14, preferably a copper containing material from a damascene processing step, comprising the following steps: (1) providing an abrasive free first chemical mechanical polishing slurry that has a high removal rate on copper 14 and a low removal rate on barrier material 13; (2) chemical mechanically polishing a semiconductor wafer surface 10 with the abrasive free slurry, wherein the abrasive free chemical mechanical polishing formulation comprises an oxidizing agent and an activating agent and said formulation having a pH in a range from about 0.1 to 6.9.

The method of the present invention, overcomes the problems associated with the abrasive component of the first slurry chemical mechanical processing step in that:

scratches caused by the solid abrasive are eliminated;

peeling due to frictional force between the polishing abrasive and the metal film surface during CMP are eliminated;

mechanical cleaning step to remove polishing abrasive left behind after the polishing step is eliminated;

cost of abrasives, polishing pads, slurry feeders, processor for slurry containing waste and pumps, filters, monitoring equipment, and stirrers to prevent sedimentation of the abrasive in the slurry distribution system are reduced or eliminated; and a system to suppress dust in the exhaust duct of the CMP machine is eliminated.

Generally, the slurry is applied to a pad contained on a polishing instrument. Polishing instrument parameters such as down force (DF), flow rate (FR), table speed (TS), quill speed (QS), and pad type can be adjusted to effect the results of the CMP slurry. These parameters are important in obtaining efficient planarization results and limiting dishing and erosion. Although these parameters may be altered, when used with the CMP slurry of the present invention, the standard conditions used are DF in a range of from about 3–6 psi, FR in a range of from about 100–200 mL/min, TS in a range of from about 80 to 150 rpm, QS in a range of from about 50 to 130 rpm, and the IC 1000 pad type. Preferably the conditions used in the present invention include DF of 4 psi, FR of 160 mL/min, TS of 125 rpm, QS of 116 rpm, and the Rodel IC 1000 pad type.

Figure 2:
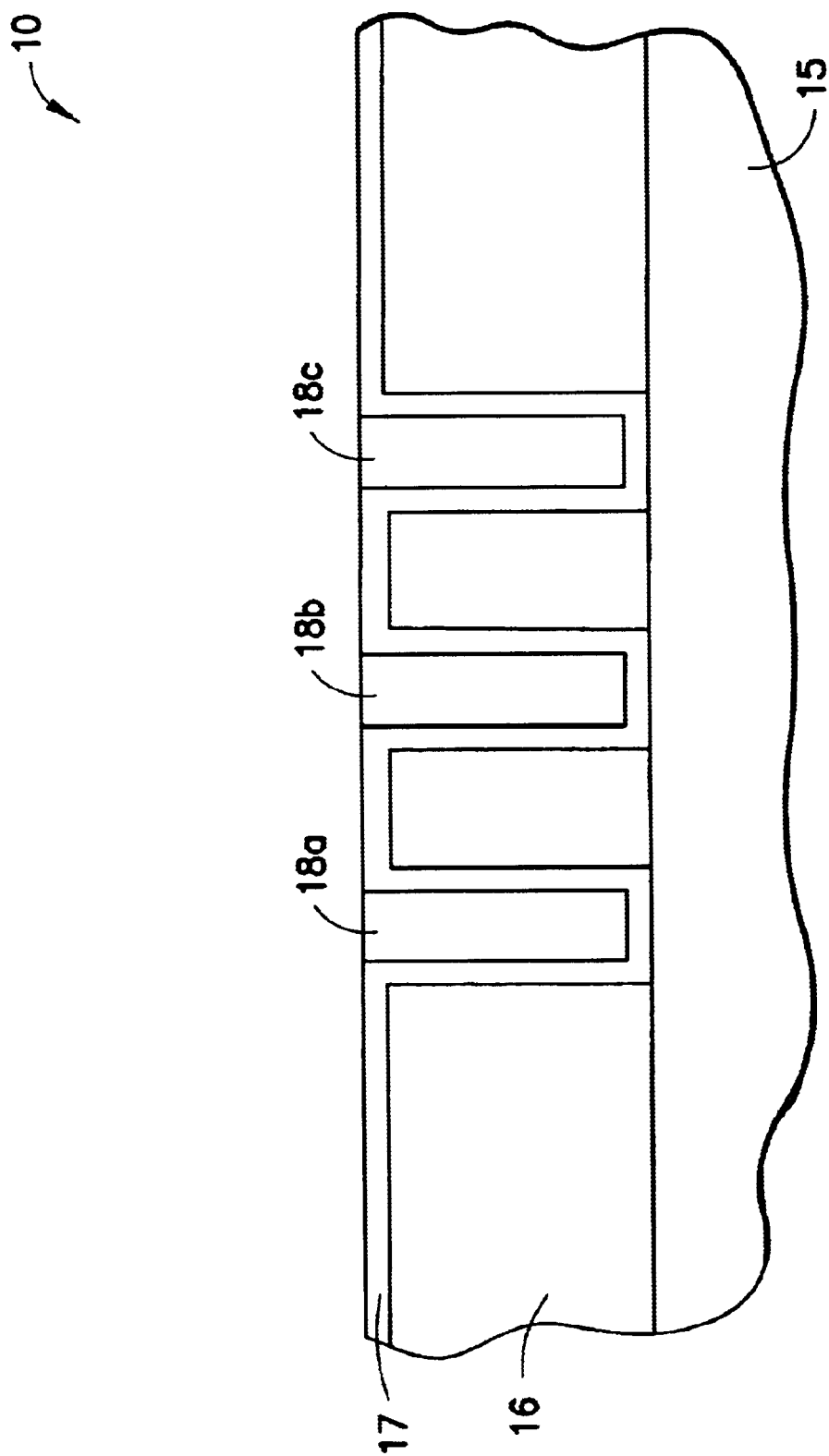
FIG. 2 is a cross sectional view of the semiconductor wafer of FIG. 1 following chemical mechanical polishing with the abrasive free formulation of the present invention.

FIG. 2 illustrates the semiconductor wafer 10 of FIG. 1, after steps (1) and (2) of the present method for CMP have been carried out, and the semiconductor wafer surface has been polished with the abrasive free chemical mechanical polishing formulation of the present invention. When FIG. 2 is compared to FIG. 1, the top copper layer 14 in FIG. 1 has been preferentially removed, and only the copper in the trenches (FIG. 2) 18a, 18b, and 18c is left. As shown in FIG. 2 the barrier material layer 17 is substantially intact, and the dielectric material 16 based on substrate 15 is still unexposed.

By using the abrasive free polishing formulation of the present invention, with the selectivities described in Table 1, and following the described method, copper dishing (FIG. 3) and oxide erosion (FIG. 4) can be reduced. FIG. 3 shows a semiconductor wafer to which a CMP slurry has been applied, which had a higher selectivity for copper 26a, 26b, 26c than for the barrier material 25a, 25b, 25c or dielectric material 24. As a result, disparate amounts of copper are removed from the surface of the semiconductor wafer. This is known as copper dishing and is shown by the dish-like troughs 27a, 27b, and 27c in the trenches of copper 26a, 26b, 26c. The abrasive free CMP formulation of the present invention and method of using this formulation greatly reduces copper dishing.

FIG. 4 shows a semiconductor wafer to which a CMP slurry has been applied, which has a higher selectivity for the dielectric material 29 than for the barrier material 30a, 30b, 30c, or copper 31a, 31b, 31c. As a result, disparate amounts of dielectric material are removed from the surface of the semiconductor wafer. This is known as oxide erosion or dielectric erosion and is shown by the indentions and/or reduction of the dielectric material 29a, 29b. The abrasive free CMP formulation of the present invention and method of using such formulation greatly reduces oxide erosion or dielectric erosion.

During the damascene process, grooves are dry etched into an insulating thin film to form an interconnect pattern. Copper or copper alloy is deposited over the entire wafer surface, reflecting the groove which is the interconnect pattern. If left unattended, the elevational disparities in each level of an integrated circuit can lead to various problems. For example, when dielectric, conductive, or semiconductive material is deposited over a topological surface having elevationally raised and recessed regions, step coverage problems may arise. Step coverage is defined as a measure of how well a film conforms over an underlying step and is expressed by the ratio of the minimum thickness of a film as it crosses a step to the nominal thickness of the film over horizontal regions. Also, stringers may arise from incomplete etching, polishing, or redeposition of metal.

The present invention provides a method for planarizing and polishing at least a portion of a surface of a semiconductor wafer onto which has been deposited a metal containing layer. The method comprising the steps of:

providing an aqueous polishing formulation comprising an oxidizing agent, and an activating agent, said polishing formulation having a pH in a range of from about 0.1 to 6.9; and chemical mechanically polishing a semiconductor wafer surface with said formulation.

The formulation of the present invention oxidizes the copper metal layer, to form a thin metal oxide layer on the substrate surface. The activating agent solubilizes and/or etches the thin oxide layer and under CMP conditions, the removal of the thin oxide layer is accelerated by the friction imposed on the oxide layer by the polishing pad. Because the pad, contacts only the projections on the wafer surface, the polishing occurs more slowly in the lower level topography regions, resulting in a wafer surface having improved planarization.

Although the present invention is directed to removal of copper and copper containing materials, it is not this limited to such. The present invention is also useful for polishing and planarizing other materials useful as interconnects in semiconductor related applications including but not limited to aluminum, aluminum alloys, aluminum compounds having aluminum as its principal component, tungsten, tungsten alloys, tungsten compounds having tungsten as its principal component, (i.e., tungsten nitride), tantalum, tantalum nitride, silicon doped tantalum nitride, titanium, titanium alloys and titanium compounds having titanium as its principal component (i.e., titanium nitride and silicon doped titanium nitride).

The copper containing material removed in the present invention may be deposited in any number of ways and as such is not limited to the examples provided herein. Specific methods for depositing copper containing thin films include CVD, PVD, electroplating, and electroless deposition.

The formulation of the present invention is useful for removal and planarization of the bulk copper layer deposited in a damascene process step, but is not limited to such. The present invention may be useful for removing copper and copper containing materials from any substrate comprising same.

Further, the abrasive free formulation of the present invention may be useful in processes relating to: cleaning semiconductor wafer surfaces; bulk metal removal; planarization; first step underpolishing; first step overpolishing, and neutral or intermediate first step polishing.

Further, the present invention may further comprise a second polishing step comprising a formulation having a high removal rate on barrier material a low or comparable removal rate on copper and a low removal rate on the dielectric material.

The features, aspects and advantages of the present invention are further shown with reference to the following non-limiting examples relating to the invention.

EXAMPLES

Example 1

Polishing Performance Comparison of Abrasive Free Slurry Formulations (AFS) 1 and 2

Table 2 provides a summary of the composition of two abrasive free slurries for polish performance comparison and Table 3 provides actual experimental results for the abrasive free polishing formulation as used on 8" blanket films wafers of the following composition and thickness: copper wafer (5,000 Å thermal oxide, 300 Å tantalum, 1,500 Å PVD copper seed layer and 15,000 Å electroplated copper), tantalum nitride wafer (5,000 Å thermal oxide and 3,000 Å tantalum nitride), tantalum wafer (5,000 Å thermal oxide and 3,000 Å tantalum), and plasma enhanced tetraethyl orthosilicate (9,000 Å PETEOS).

TABLE 2

Abrasive Free Slurry (AFS) Formulations AFS 1 and AFS 2

| AFS 1 Component | Final Weight Percent | AFS 2 Component | Final Weight Percent |
|---|---|---|---|
| HIO$_3$ | 4.00 | HIO$_3$ | 4.00 |
| IDA | 0.20 | IDA | 0.20 |
| H$_3$PO$_4$ | 0.75 | Citric Acid | 0.20 |
| KOH | 1.73 | KOH | 1.37 |
| H$_2$O | Balance | H$_2$O | balance |

TABLE 3

Polishing Performance Comparison AFS 1 vs. AFS 2

| | AFS 1** Room Temp. | 45° C. | AFS 2 Room Temp. | 45° C. |
|---|---|---|---|---|
| Cu RR* (Å/min) | 3166 | 3421 | 3513 | 3926 |
| TaN RR (Å/min) | 34.76 | 1 (neg)* | 57.65 | N/A |
| Ta RR (Å/min) | 0.6383 | 1 (neg)* | 7.03 | N/A |
| PETEOS (Å/min) | 4.85 | 24 | 4.81 | N/A |
| Selec. Cu:TaN | 91.11 | 3400 | 600 | N/A |
| Selec. Cu:Ta | 4960 | 3400 | 61 | N/A |
| Selec: Cu:PETEOS | 653 | 1425 | 730 | N/A |

*RR represents removal rate
**For AFS 1 & 2 (Down Force = 4 psi, Flow Rate = 160 mL/min, Table Speed = 125 rpm, Quill Speed = 116 rpm, Pad Type = IC 1000)

Example 2

Planarization Performance and Step Height Reduction

Figure 5:
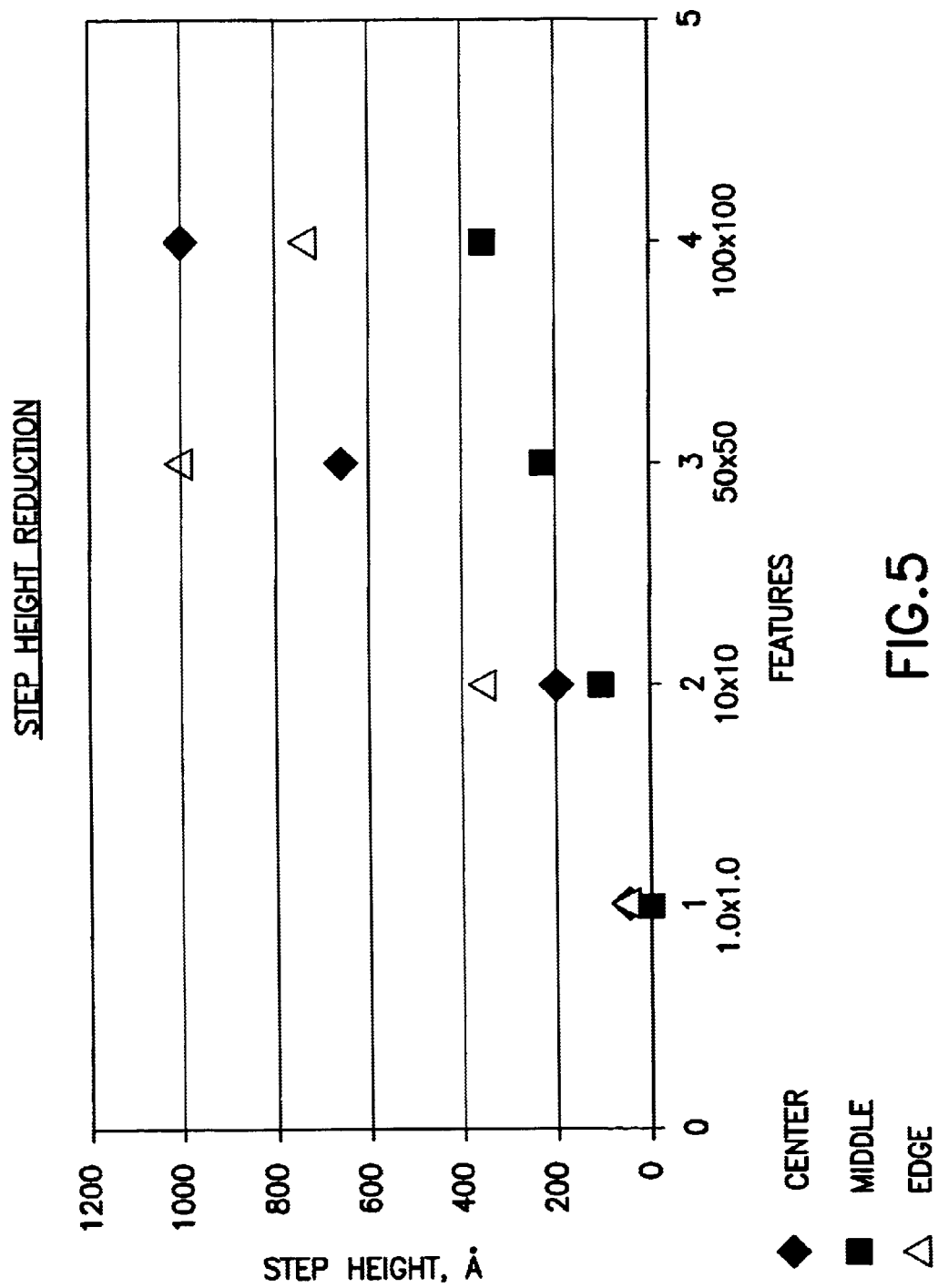
FIG. 5 is a plot showing planarization performance and step height reduction at room temperature of one abrasive free slurry formulation of the present invention.
Figure 7:
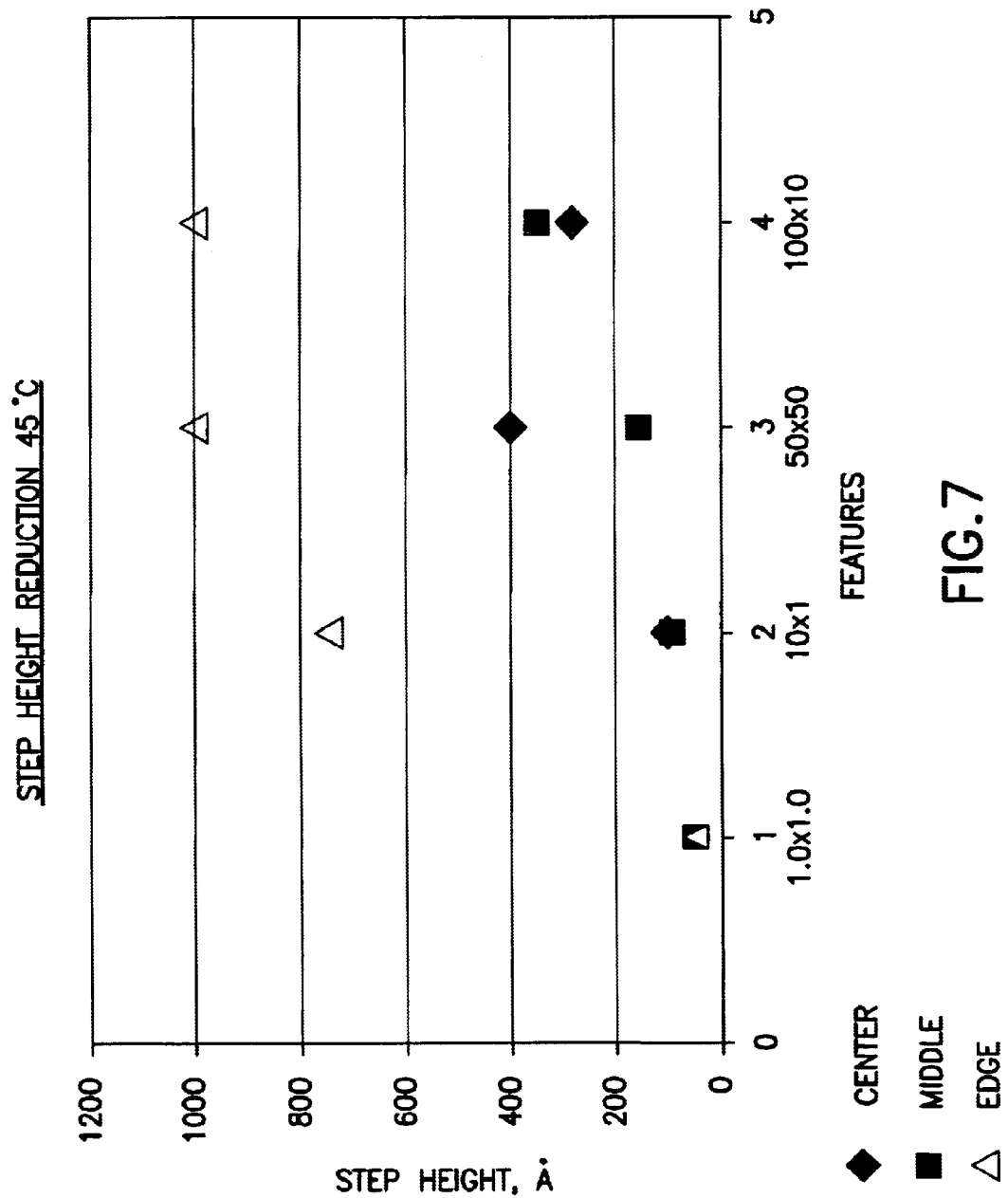
FIG. 7 is a plot showing planarization performance and step height reduction at 45° C. of one abrasive free slurry formulation of the present invention.

One object of CMP processing is to produce a uniform surface on the semiconductor wafer. The uniformity of the planarized surface is a function of several factors. FIGS. 5 and 7 are plots showing the step height remaining verses different copper/dielectric pattern densities on a Sematech 854 CMP AZ mask test wafer after underpolishing with an abrasive free polishing formulation for a bulk copper-polishing step according to one embodiment of the present invention. The initial step height before polishing was approximately 6000 Å. The data plotted in FIG. 5 is based on room temperature experimental conditions and the data plotted in FIG. 7, 45° C. The substantial step height reduction on the patterned wafers while underpolishing evidences the commercial viability of the present invention.

Example 3

Planarization Performance and Array Recess

Figure 6:
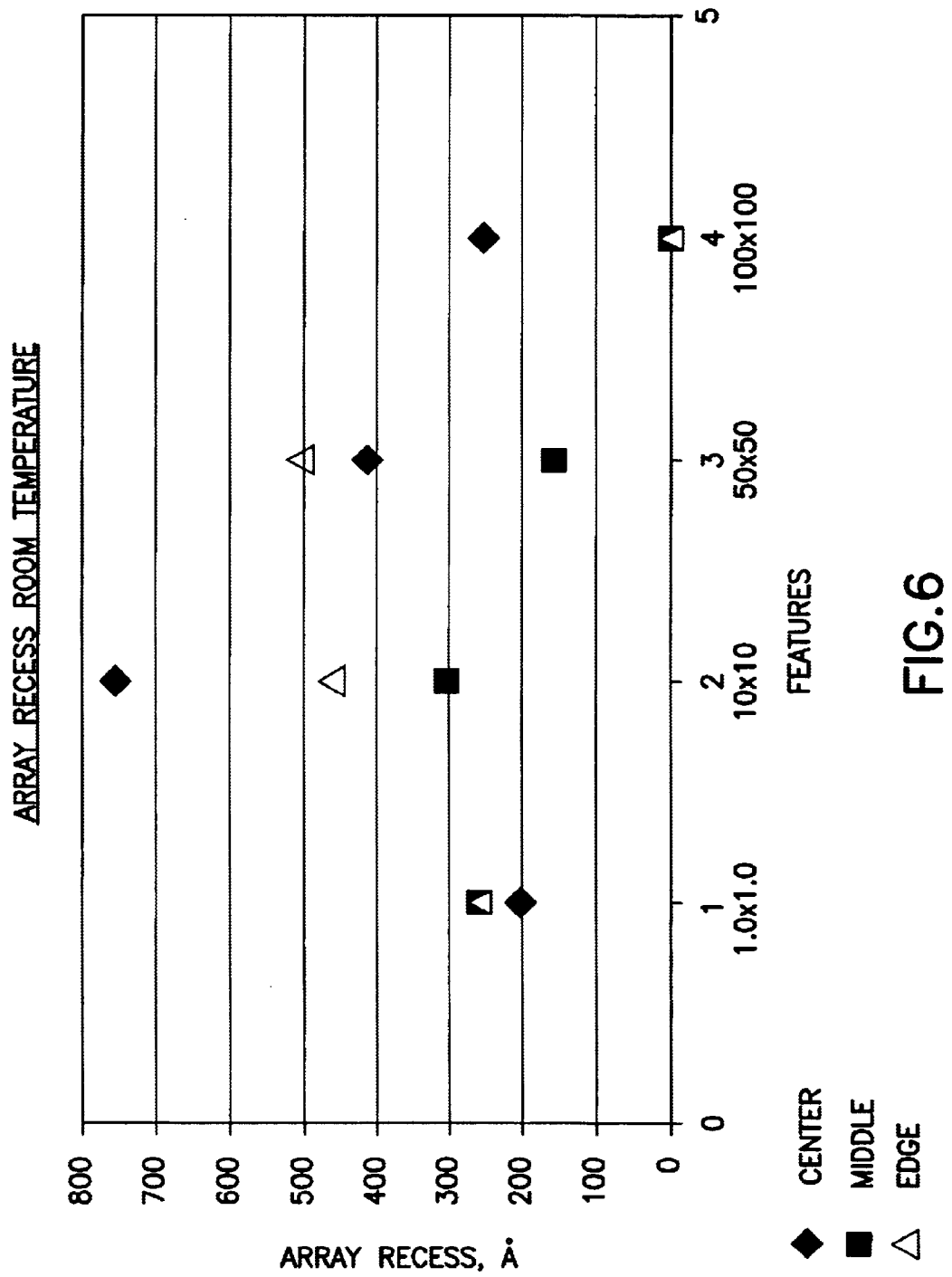
FIG. 6 is a plot showing planarization performance and array recess at room temperature of one abrasive free slurry formulation of the present invention.
Figure 8:
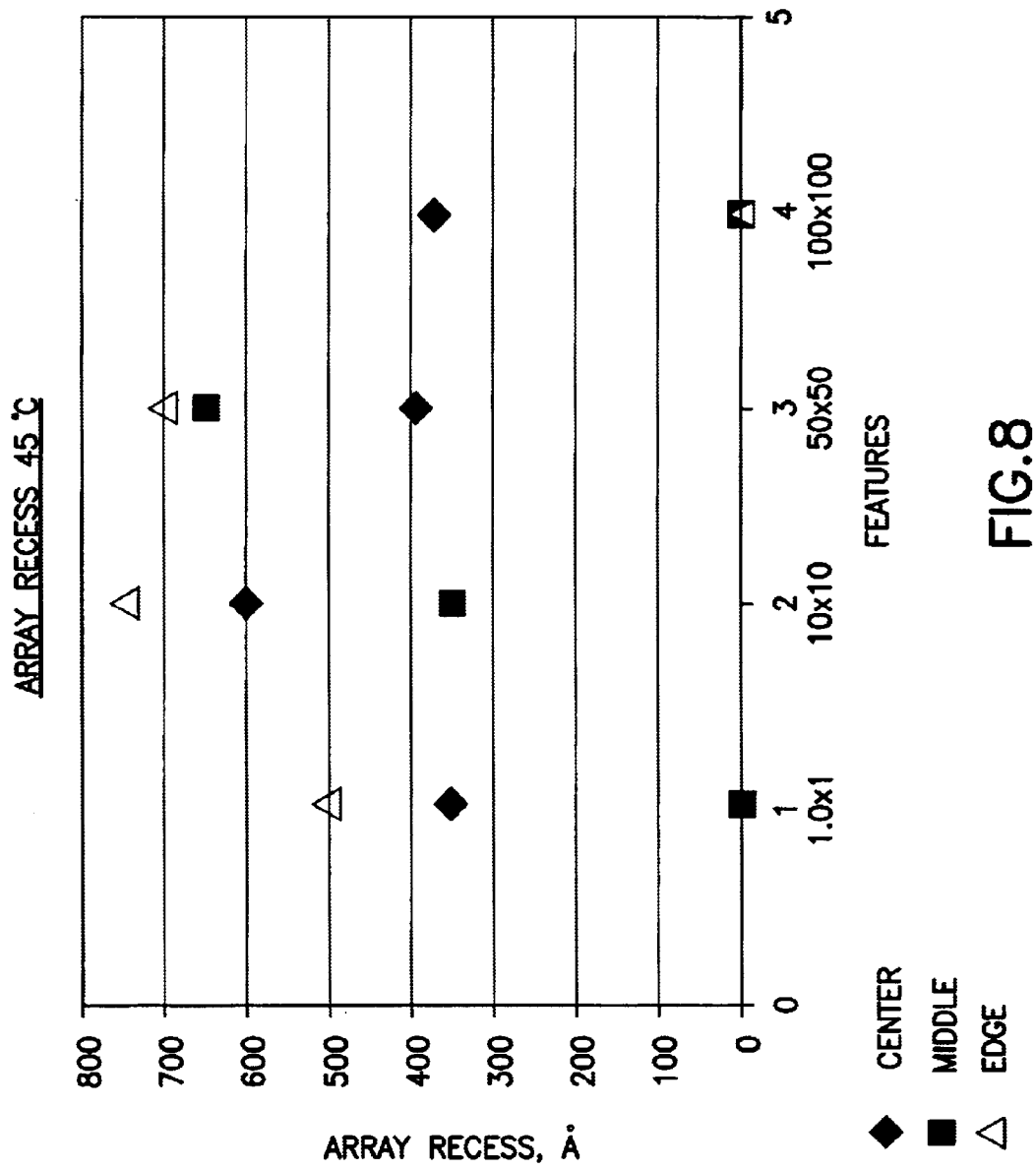
FIG. 8 is a plot showing planarization performance and array recess at 45° C. of one abrasive free slurry formulation of the present invention.
Figure 9:
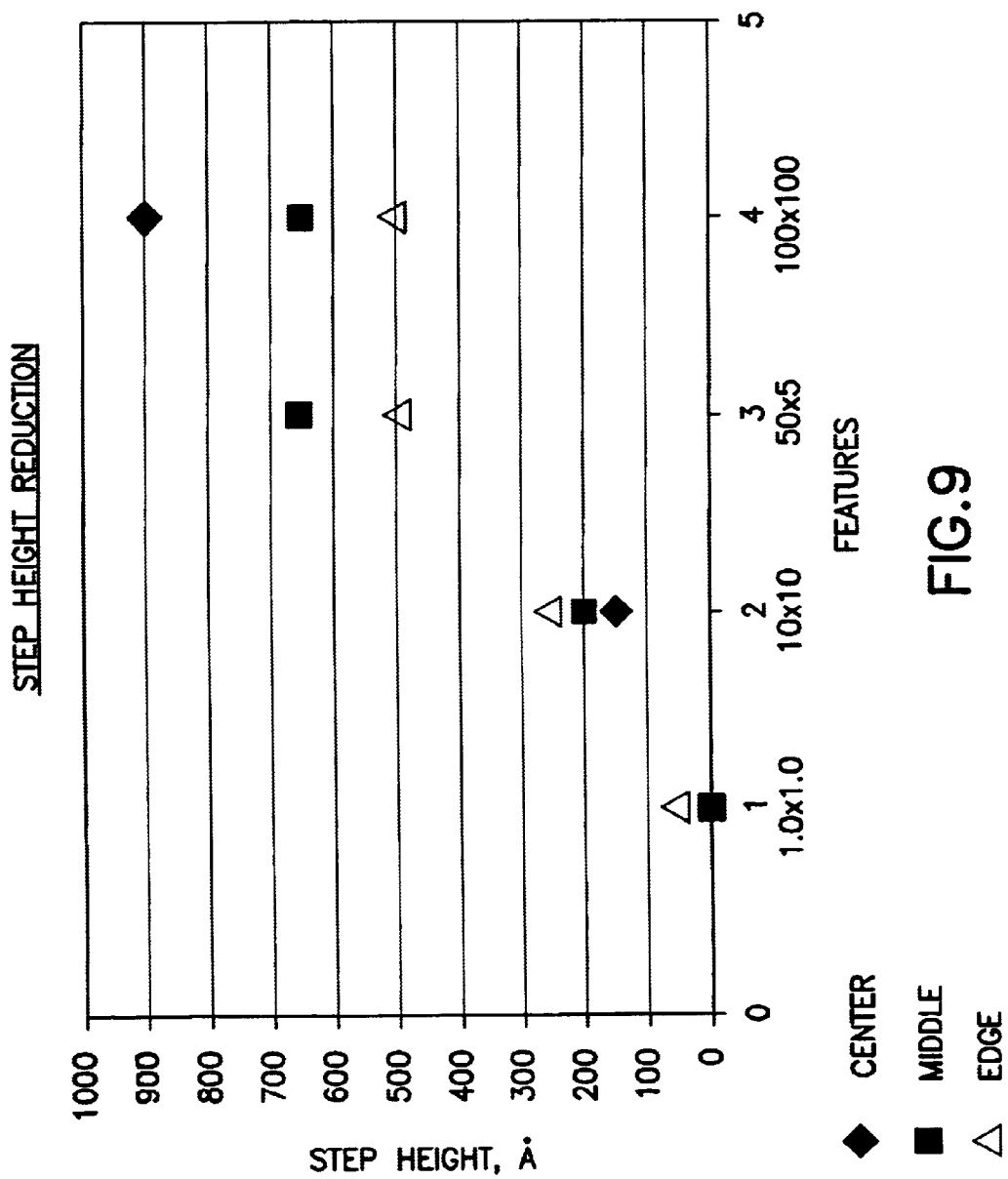
FIG. 9 is a plot showing planarization performance and step height reduction at room temperature of a second abrasive free formulation of the present invention.
Figure 10:
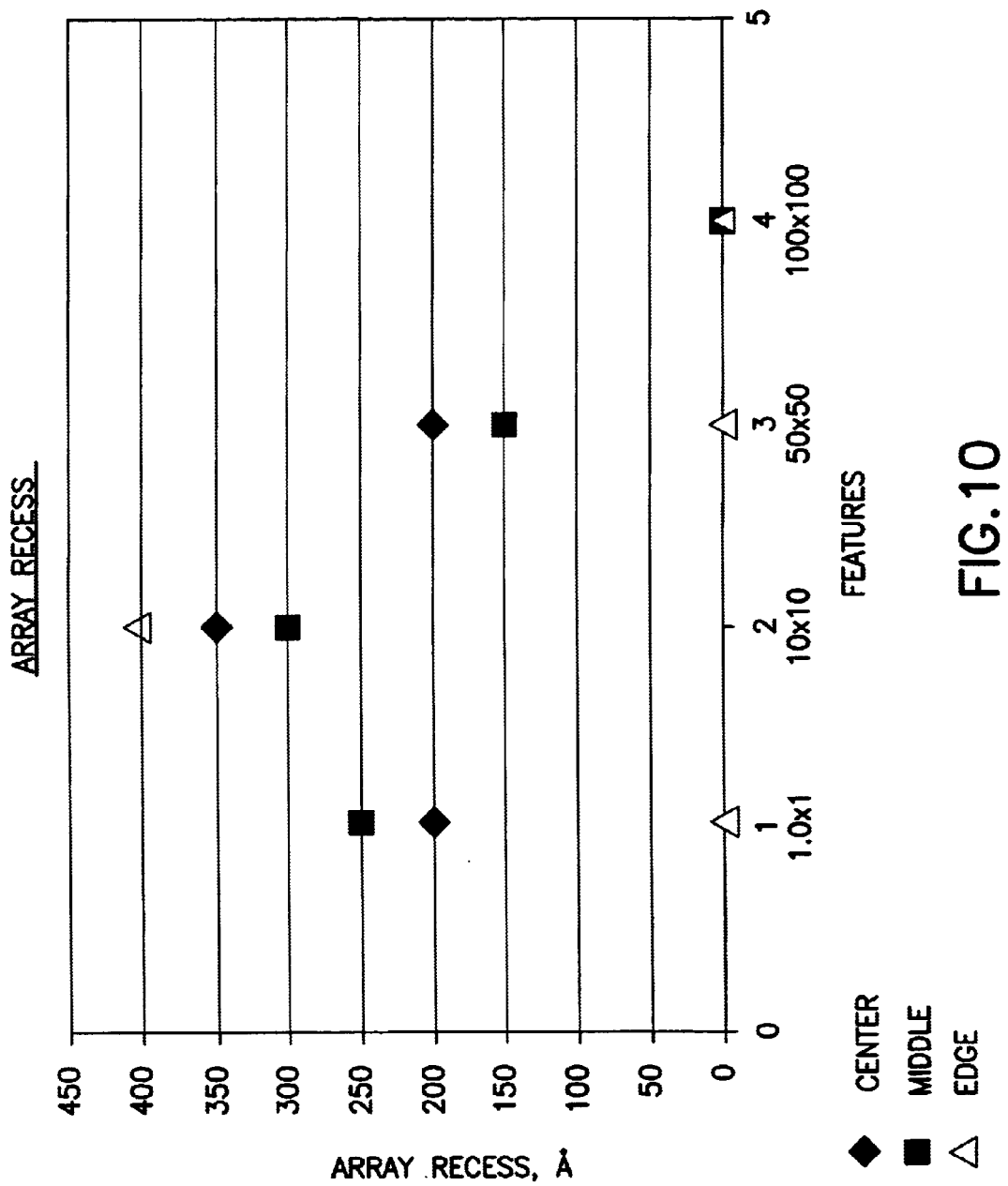
FIG. 10 is a plot showing planarization performance and array recess at room temperature of a second abrasive free slurry formulation of the present invention.

FIGS. 6 and 8 are plots showing the array recess verses different copper/dielectric pattern densities based on using the same abrasive free polishing formulation and substrate as in the previous step height reduction experimental. The data plotted in FIG. 6 is based on room temperature experimental conditions and the data plotted in FIG. 8, 45° C. The low levels of array recess are further evidence of the commercial viability of the abrasive free polishing formulation.

What is claimed is:

1. An abrasive free polishing formulation for removing at least a portion of a metal film, said formulation comprising an iodate-salt, oxidizing-agent and a corrosion inhibitor selected from nitrilotriacetic acid and imipodiacetic acid, said formulation having a pH in a range of from about 0.1 to 6.9.

2. The abrasive free polishing formulation according to claim 1, wherein the oxidizing agent is selected from the group consisting of potassium iodate, ammonium iodate, ammonium periodate, tetramethylammonium iodate, tetramethylammonium periodate.

3. The abrasive free polishing formulation according to claim 1, wherein the corrosion inhibitor is iminodiacetic acid.

4. The abrasive free polishing formulation according to claim 1, wherein the metal film comprises copper, a copper alloy or a copper compound having copper as its principal component.

5. The abrasive free polishing formulation according to claim 1, wherein the metal film comprises aluminum, an aluminum alloy or an aluminum compound having aluminum as its principal component.

6. The abrasive free polishing formulation according to claim 1, wherein the metal film comprises tungsten, a tungsten alloy or a tungsten compound having tungsten as its principal component.

7. The abrasive free polishing formulation according to claim 1, wherein the tungsten compound is a tungsten nitride.

8. The abrasive free polishing formulation according to claim 1, wherein the metal film is selected from the group consisting of titanium, a titanium alloy, or a titanium compound having titanium as its principal component.

9. The abrasive free polishing formulation according to claim 8, wherein the titanium compound is selected from the group consisting of titanium nitride and silicon doped titanium nitride.

10. The abrasive free polishing formulation according to claim 1, wherein the metal film is selected from the group consisting of tantalum, a tantalum alloy or a tantalum compound having tantalum as its principal component.

11. The abrasive free polishing formulation according to claim 10, wherein the tantalum compound is selected from the group consisting of tantalum nitride and silicon doped tantalum nitride.

12. The abrasive free polishing formulation according to claim 1, further comprising an activating agent.

13. The abrasive free polishing formulation according to claim 12, wherein the activating agent is selected from the group consisting of inorganic and organic acids.

14. The abrasive free polishing formulation according to claim 13, wherein the inorganic acid is selected from the group consisting of phosphoric acid, fluoroboric acid, and iodic acid.

15. The abrasive free polishing formulation according to claim 13, wherein the organic acid is selected from the group consisting of citric acid, malic acid oxalic acid, malonic acid, acetic acid and pivalic acid.

16. The abrasive free polishing formulation according to claim 1, further comprising a pH modifier in such amounts to modify the pH to a region of about 0.1 to 6.9, wherein said pH modifier is selected from the group consisting of: potassium hydroxide, sodium hydroxide, ammonium hydroxide, tetramethylammonium hydroxide, or quaternary ammonium hydroxide.

17. The abrasive free polishing formulation according to claim 1, further comprising a cleaning agent.

18. The abrasive free polishing formulation according to claim 17, wherein the cleaning agent is a carboxylic acid.

19. The abrasive free polishing formulation according to claim 18, wherein the cleaning agent is selected from the group consisting of glycine, oxalic acid, malonic acid, succinic acid, citric acid and nitrilotriacetic acid.

20. The abrasive free polishing formulation according to claim 17, wherein the cleaning agent is a dicarboxylic acid.

21. The abrasive free polishing formulation according to claim 20, wherein the dicarboxylic acid has a nitrogen containing functional group.

22. The abrasive free polishing formulation according to claim 20, wherein the dicarboxylic acid is iminodiacetic acid.

23. An abrasive free polishing formulation comprising an oxidizing agent, a corrosion inhibitor, an activating agent and a cleaning agent, wherein the corrosion inhibitor is selected from nitrilotriacetic acid and iminodiacetic acid.

24. The abrasive free polishing formulation according to claim 23 comprising the composition:

| | | |
|---|---|---|
| a. | Oxidizing agent | 0.1 to 20% by weight |
| b. | Corrosion inhibitor | 0 to 5% by weight |
| c. | Activating agent | 0 to 5% by weight |
| d. | Cleaning agent | 0 to 5% by weight. |

25. The abrasive free polishing slurry according to claim 24 further comprising water.

26. The abrasive free polishing slurry according to claim 24, further comprising a pH modifier in such amounts as to modify the pH to a region of about 0.1 to 6.9, wherein said pH modifier is selected from the group consisting of: potassium hydroxide, sodium hydroxide, ammonium hydroxide, tetramethylammonium hydroxide, or quaternary ammonium hydroxide.

27. The abrasive free polishing formulation according to claim 24, wherein the cleaning agent is an inorganic acid.

28. The abrasive free polishing formulation according to claim 24, wherein the corrosion inhibitor is iminodiacetic acid.

29. The abrasive free polishing formulation according to claim 24, comprising the composition:

| | | |
|---|---|---|
| a. | $HIO_3$ | 4% by weight |
| b. | IDA | 0.2% by weight |
| c. | $H_3PO_4$ | 0.75% by weight |
| d. | KOH | 1.73% by weight |
| e. | Water | balance. |

30. The abrasive free polishing formulation according to claim 24, wherein the pH of the polishing formula is in the range of from about 0.1 to 6.9.

31. The abrasive free polishing formulation according to claim 24, wherein the pH of the polishing formula is about 3.5.

32. The polishing formulation according to claim 24, wherein the oxidizing agent is selected from the group consisting at hydrogen peroxide, potassium iodate, ferric nitrate, ammonium chlorite, ammonium chlorate, ammonium iodate, ammonium perborate, ammonium perchlorate, ammonium periodate, ammonium persulfate, tetramethylammonium chlorite, tetramethylammonium chlorate tetramethylammonium iodate, tetramethylammonium perborate, tetramethylammonium perchlorate, tetramethylammonium periodate, tetramethylammonium persulfate, urea hydrogen peroxide, 4-methylmorpholine N-oxide ($C_5H_{11}NO_2$) and pyridine N-oxide ($C_5H_5NO$).

33. An abrasive free polishing formulation, comprising:

| | | |
|---|---|---|
| a. | $HIO_3$ | 4% by weight |
| b. | IDA | 0.2% by weight |
| c. | $H_3PO_4$ | 0.75% by weight |
| d. | KOH | 1.73% by weight |
| e. | Water | balance. |

34. An abrasive free polishing formulation for removing at least a portion of a metal film, comprising an oxidizing agent and a corrosion inhibitor said oxidizing agent being selected from the group consisting of, ammonium chlorite, ammonium chlorate, ammonium iodate, ammonium perborate, ammonium perborate, ammonium periodate, ammonium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, urea hydrogen peroxide, 4-methylmorpholine N-oxide, and pyridine N-oxide.

35. An abrasive free polishing formulation for removing at least a portion of a metal film, comprising an amine N-oxide, oxidizing agent end a corrosion inhibitor.

36. The abrasive free polishing formulation according to claim 35, wherein said oxidizing agent comprises the formula ($R_1R_2R_3N \rightarrow O$), wherein $R_1R_2R_3$ are independently selected from the group consisting of: H and $C_1$–$C_8$ alkyl.

* * * * *